United States Patent
Pascucci et al.

[19]

[11] Patent Number: 6,148,413
[45] Date of Patent: *Nov. 14, 2000

[54] MEMORY UNDER TEST PROGRAMMING AND READING DEVICE

[75] Inventors: Luigi Pascucci, Sesto San Giovanni; Marco Fontana, Milan, both of Italy

[73] Assignee: SGS-Thomson Microelectronics S.r.l., Agrate Brianza, Italy

[*] Notice: This patent issued on a continued prosecution application filed under 37 CFR 1.53(d), and is subject to the twenty year patent term provisions of 35 U.S.C. 154(a)(2).

[21] Appl. No.: 08/835,030

[22] Filed: Mar. 28, 1997

[30] Foreign Application Priority Data

Mar. 29, 1996 [GB] United Kingdom ................. 96830161

[51] Int. Cl.⁷ ............................. H02H 3/05; G11C 29/00
[52] U.S. Cl. ................................ 714/8; 714/47; 714/48; 714/723; 365/200; 365/201
[58] Field of Search ......................... 395/185.01, 184.01, 395/183.12; 371/21.4, 25.1, 28, 22.1, 16; 345/211, 212; 365/201, 200; 714/47, 48, 14, 736, 745, 721, 723.8; 713/340

[56] References Cited

U.S. PATENT DOCUMENTS

| | | | |
|---|---|---|---|
| 4,802,166 | 1/1989 | Casagrande et al. | 371/21 |
| 5,022,009 | 6/1991 | Terada et al. | 365/210 |
| 5,025,344 | 6/1991 | Maly et al. | 361/88 |
| 5,117,426 | 5/1992 | McAdams | 371/214 |
| 5,237,697 | 8/1993 | Nakano | 395/750 |
| 5,245,572 | 9/1993 | Kosonocky et al. | 365/189 |
| 5,388,070 | 2/1995 | Frerichs | 365/185 |
| 5,400,343 | 3/1995 | Crittenden et al. | 371/21.4 |
| 5,459,734 | 10/1995 | Yokoyama | 371/22.1 |
| 5,500,601 | 3/1996 | Lisart et al. | 324/713 |
| 5,510,748 | 4/1996 | Erhart et al. | 327/530 |
| 5,544,175 | 8/1996 | Posse | 371/25.1 |
| 5,621,439 | 4/1997 | Okada et al. | 345/211 |
| 5,687,178 | 11/1997 | Herr et al. | 371/21.4 |
| 5,689,430 | 11/1997 | Ohno et al. | 364/483 |
| 5,710,778 | 1/1998 | Bettman et al. | 371/22.2 |
| 5,923,674 | 7/1999 | Nakadai | 371/21.4 |

FOREIGN PATENT DOCUMENTS

0 214 705  3/1987  European Pat. Off. ........ G11C 17/00

OTHER PUBLICATIONS

IEEE International Solid State Circuits Conference, vol. 36, Feb. 1993, New York, US pp. 42–43, Rosendale et al, "A 13–ns Mb CMOS EPROM Using 1–T FAMOS Technology".

*Primary Examiner*—Norman M. Wright
*Attorney, Agent, or Firm*—Wolf, Greenfield & Sacks, P.C.; James H. Morris; Theodore E. Galanthay

[57] ABSTRACT

Programming and reading management architecture, particularly for test purposes, for memory devices of the non-volatile type, comprising at least two memory half-matrices, a bidirectional internal bus for the transmission of data to and from the memory half-matrices, a programming unit for each one of the at least two memory half-matrices, and a data sensing unit. The programming units are adapted to program the at least two memory half-matrices and the data sensing unit and the programming units communicate with the bidirectional internal bus to reroute onto the bus reading data and programming data of the at least two memory half-matrices.

41 Claims, 4 Drawing Sheets

MEMORY UNDER TEST PROGRAMMING AND READING DEVICE

BACKGROUND OF THE INVENTION

1. Field of the Invention

The present invention relates to a programming and reading management architecture, particularly for test purposes, for memory devices of the non-volatile type.

2. Discussion of the Related Art

In non-volatile memories it is particularly important to provide an architecture that allows quick programming of the memory with preset programming voltages.

In conventional architecture, the programming voltage of the various memory cells is never uniform due to the drops in voltage along the lines.

The case thus occurs in which the memory cells that are closer to the programming means are programmed with an optimum voltage, whereas, as one moves further away from the point where the programming voltage is generated, the programming voltage decreases due to the above mentioned voltage drops of the lines. Therefore, the memory cells which are more distant from the programming means are programmed with decreasing voltage values that can differ even considerably from those of the memory cells which are closer to the programming means.

In order to contain the non-uniformity of the programming voltage levels, it is necessary to program a small number of bits at a time, so that the voltage value differences are negligible.

This approach is valid when byte programming is performed. It is not equally valid when, during testing, parallel programming is performed to reduce programming time requirements.

Abandoning or containing parallel programming leads to the drawback of increasing the programming times at the detriment of the low cost of the finished memory device.

It is in fact evident that the programming of large memory matrices is hindered by the difficulty in achieving uniform programming voltages except for a small number of memory cells at a time.

This drawback will become increasingly important as memory construction technology improves, leading to ever larger sizes of memories. These larger sizes are achieved by reducing the thicknesses and the size of the programming lines (this entails higher resistivity).

Furthermore, in the case of the programming of multiple bits in parallel, using a redundancy system for output lines, if there are two defective cells in two different bit lines, it is not possible to resort to the redundancy lines provided for replacement of the defective lines, since it is not possible to apply redundancy to two different lines simultaneously. This results in the important drawback of having to reject, during testing, a memory device that has this situation, or of having to take a much longer time by using only byte programming.

Regarding the direct memory access function, this function is usually provided by virtue of additional lines that allow direct access to the memory for inspection purposes. The additional lines add to the normal lines provided for programming and reading the data, resulting in the drawback of increasing the space occupation of the memory device and of reducing its reliability.

SUMMARY OF THE INVENTION

An aim of the present invention is therefore to provide an architecture that advantageously manages programming, reading, and the various test activities, particularly for memory devices of the non-volatile type.

Within the scope of this aim, an object of the present invention is to provide a programming management architecture for memory devices that performs programming of the memory matrix with programming voltage control, so as to perform uniform programming for the various memory cells of the matrix.

Another object of the present invention is to provide a programming management architecture for memory devices, particularly of the non-volatile type, that performs memory cell programming independent of the voltage drops along the programming line.

Another object of the present invention is to provide an architecture for the programming and reading management, for test purposes, of memory devices that acquires a reference signal for programming at a point that is free from voltage drops of any kind.

Another object of the present invention is to provide a programming management architecture for memory devices, particularly of the non-volatile type, that performs parallel programming and maintains the possibility of redundancy of any defective lines.

Another object of the present invention is to provide an architecture for the programming and reading management of memory devices, particularly of the non-volatile type, for test purposes, that performs direct memory accesses without requiring additional paths besides the normal reading paths.

Another object of the present invention is to provide an architecture for the programming and reading management of memory devices, particularly of the non-volatile type, for test purposes, that provides for symmetry and reversibility of the reading paths, so as to facilitate path balancing.

Another object of the present invention is to provide an architecture for the programming and reading management of memory devices, particularly of the non-volatile type, for test purposes, that minimizes the size of the memory device.

Another object of the present invention is to provide an architecture for the programming and reading management of memory devices for test purposes that preserves substantial independence of the data lines, so as to allow further uses thereof even in a time-shared mode.

Another object of the present invention is to provide an architecture that is highly reliable, relatively easy to produce and available at competitive costs.

This aim, these objects, and others that will become apparent hereinafter are achieved by a programming and reading management architecture, particularly for test purposes, for memory devices of the non-volatile type, comprising at least two memory half-matrices, a bidirectional internal bus for the transmission of data to and from the memory half-matrices, a programming unit for each one of the at least two memory half-matrices, and a data sensing unit. The programming units are adapted to program the at least two memory half-matrices and the data sensing unit and the programming units communicate with the bidirectional internal bus to reroute, onto the bus, reading data and programming data of the at least two memory half-matrices.

According to another embodiment of the present invention, a system for reading and programming a non-volatile memory device is disclosed, the system comprising a memory matrix divided into a right half-matrix and a left half-matrix, an internal bus for the transmission of data to and from the memory matrix and a number n of data sensing units, each comprising a first input coupled to the left half-matrix and a second input coupled to said right half-matrix, for respectively reading data from the left half-matrix and the right-half matrix, and an output coupled to the internal bus. The system further comprises a number 2n of programming units, two of the programming units being associated with each of the data sensing units, wherein a left one of the two programming units is coupled between the left half-matrix and the internal bus and a right one of the two programming units is coupled between the right half-matrix and the internal bus. The left programming units read data from the internal bus and program the data to the left half-matrix and the right programming units read data from the internal bus and program the data to the right half-matrix.

Each data sensing unit comprises a sense amplifier having a first input coupled to the left half-matrix and a second input coupled to the right half-matrix, a first output and a second output; means for enabling and disabling the output of the data sensing unit; and output coupling means for coupling one of the first and second outputs of the sense amplifier to the enabling and disabling means.

Each programming unit comprises a programming device comprising a first input which receives data from the internal bus, a second input which enables and disables the programming device, a third input for receiving a reference voltage and an output for outputting the data; and direct memory access means for coupling to the memory matrix a direct memory access input from the internal bus.

According to another embodiment of the present invention, an apparatus for programming and reading data to and from a memory device is disclosed, the apparatus comprising at least two memory sub-matrices, a bidirectional internal bus for the transmission of data to and from the memory sub-matrices, and means for uniformly programming each of a plurality of memory cells coupled to each of a plurality of programming lines of the memory sub-matrices. The uniform programming means programs the memory cells independent of any voltage drops along the programming lines. The uniform programming means comprises a plurality of data sensing units, each coupled between two of the at least two sub-matrices and a number of programming units, each coupled to a programming line of one of the at least two memory sub-matrices and to one of the plurality of data sensing units. Each programming unit comprises a programming device including a first input coupled to the internal bus, a second input coupled to receive a reference voltage, a third input coupled to receive a control signal and an output coupled to the one of the at least two memory sub-matrices for outputting a programming voltage.

Each programming device further comprises a NAND gate which receives the first input and the third input, and outputs the programming voltage to a programming terminal connected to the programming line, and an adjustment device which receives the second input and the programming voltage from the programming terminal and outputs an adjusted programming voltage to the programming terminal. The adjustment device comprises a differential amplifier having an inverting input coupled to receive the reference voltage from the second input of the programming unit and a non-inverting input coupled to receive the programming voltage from the programming terminal and an output, coupled to transmit the adjusted programming voltage to the programming terminal.

The apparatus further comprises a direct memory access device for disabling the output of the programming unit and enabling data from the internal bus to provide direct access of data from the internal bus to the programming line, thereby bypassing the programming unit.

BRIEF DESCRIPTION OF THE DRAWINGS

Further characteristics and advantages of the invention will become apparent from the description of a preferred, but not exclusive, embodiment of the architecture according to the invention, illustrated only by way of non-limitative example in the accompanying drawings, wherein.

DETAILED DESCRIPTION

With reference to the figures, the architecture according to the invention involves splitting the memory matrix into at least two half-matrices (not shown), a left half-matrix and a right half-matrix. The two half-matrices are arranged so as to face each other. An internal bus, divided into a high bus $1_H$ and a low bus $1_L$, is provided for the bidirectional transmission of data and auxiliary information to and from the memory.

Figure 1:
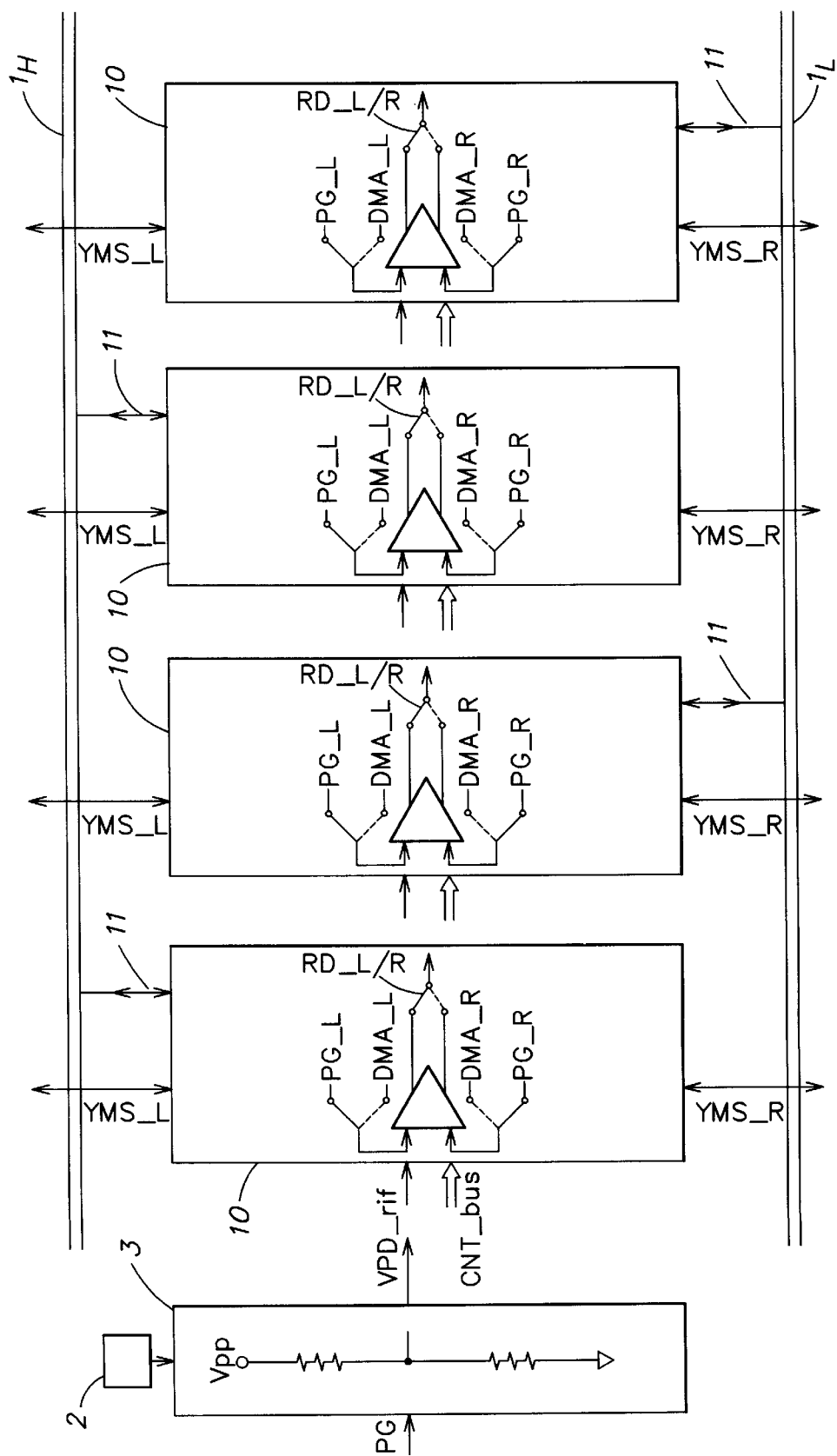
FIG. 1 is a block diagram of the programming and reading management architecture according to the invention.

In FIG. 1, the reference numeral 2 designates a programming terminal (which actually represents a number of programming terminals that is equal to the number of word bits of the memory matrix). The reference numeral 3 designates means for dividing the programming voltage $V_{PP}$, which receive as inputs, both the programming voltage $V_{PP}$ and the programming enabling signal PG. The voltage dividing means 3 produce a reference voltage VPD-rif.

With reference to the case of splitting the memory matrix into two memory half-matrices, the architecture according to the invention provides for data sensing means, duplicated programming means and direct memory access (DMA) means.

FIG. 1 is directed to a case in which each memory half-matrix is divided into a plurality of half-matrix subsections because a hierarchical decoding structure is used. Particularly, it is directed to a case in which each half-matrix is divided into four half-matrix subsections (not shown). The word size assumed for this exemplifying memory configuration is 16 bits.

According to the invention, for each half-matrix subsection, there are data sensing means, advantageously constituted by a sense amplifier 4, and duplicated programming means $5_R$ and $5_L$. Each sense amplifier 4 is of the reversible symmetrical type and it is therefore possible to swap the matrix branch with the reference branch if the left or right memory half-matrix is being read.

Figure 2:
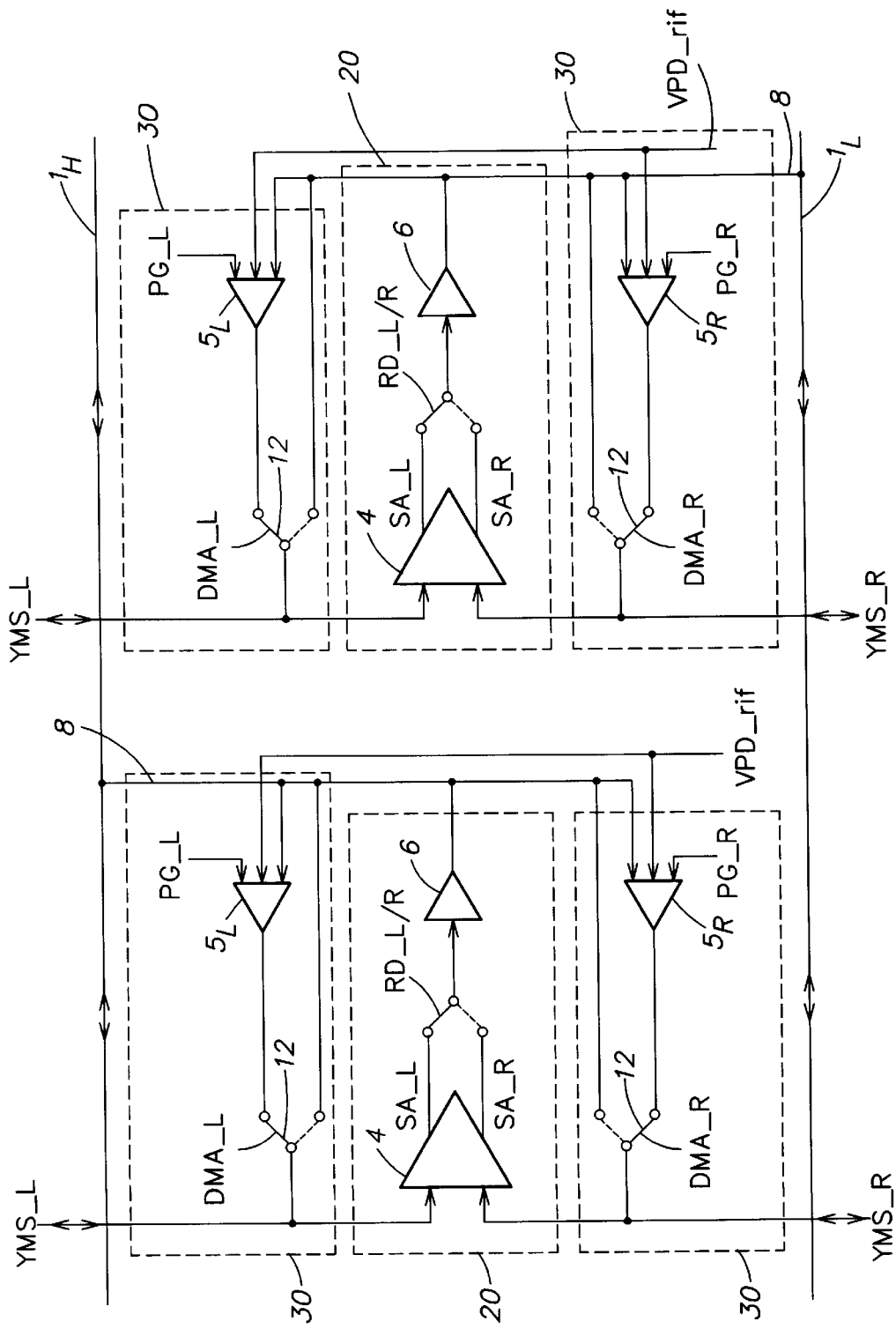
FIG. 2 is a more detailed block diagram of a portion of the architecture according to the invention shown in FIG. 1.

FIG. 2 is a detail view of two of the four structures that are provided in each array 10 for each pair of opposite half-matrix subsections, i.e., one that belongs to the left half-matrix and one that belongs to the right half-matrix.

In particular, FIG. 2 shows that for each array 10 associated with each half-matrix subsection, there are data sensing means 4 and duplicated programming means $5_R$ and $5_L$.

The programming means $5_R$ and $5_L$ are provided in four pairs for every two opposite half-matrix subsections, since each pair is meant, respectively, for one bit of the left half-matrix subsection and for one bit of the right half-matrix subsection.

Therefore, in summary, for a memory matrix with a 16-bit word length, divided into two half-matrices that are in turn divided into four half-matrix subsections each, there are sixteen sense amplifiers 4 and thirty-two programming means 5 (sixteen for the left half-matrix and sixteen for the right half-matrix). Each array 10 includes four sense amplifiers 4 and eight programming means 5. An additional sense amplifier is provided, for each half-matrix, for the redundancy lines.

In FIG. 1, the reference numeral 10 generally designates a set of four sense amplifiers 4 and of eight programming means 5. FIG. 2 shows two of the four sense amplifiers 4 and the two pairs of programming means 5, each pair associated with each sense amplifier 4.

The arrays 10 are connected, by means of the lines YMS-L and YMS-R, respectively to the left half-matrix and to the right half-matrix. The connections 11 represent the bidirectional connections to the internal bus $1_L$ and $1_H$. Each array 10 receives in input the reference programming voltage signal VPD-rif, and a bus that carries control signals CNT-bus.

With reference again to FIG. 2, only the left portion of said figure, which comprises the sense amplifier 4 and the programming means $5_R$ and $5_L$, is described since the structure and operation of the right portion is identical to the left portion.

The reference numeral 20 generally designates a data sensing unit and the reference numeral 30 generally designates a programming unit. Each data sensing unit 20 is identical to all other data sensing units 20, and each programming unit 30 is identical to all other programming units 30. Sense amplifier 4 receives in input the signals that arrive from the lines YMS-R and YMS-L, which carry the data of the right half-matrix and of the left half-matrix respectively.

The lines YMS-R and YMS-L are bidirectional, since data exchange can occur from the memory matrix to external lines or, vice versa, the data can originate externally and reach the memory matrix. The portions of the lines that reach from programming units 30 to the sense amplifier 4 are unidirectional toward the amplifier 4.

The outputs of the sense amplifiers 4 are the signals SA-R and SA-L, depending on whether the control signal RD-L/R indicates reading of the right half-matrix or of the left half-matrix respectively. The output signals SA-R and SA-L of the sense amplifier 4 thus selected are sent to enabling/disabling structures that are generally designated by the reference numeral 6.

Figure 5:
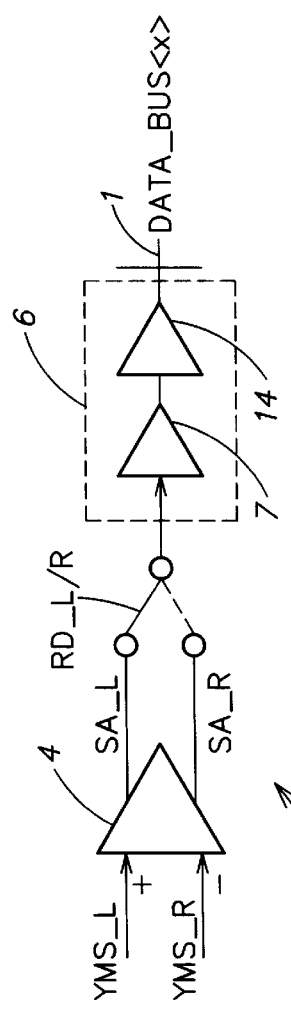
FIG. 5 is a schematic diagram of the circuitry of a portion of the architecture shown in FIG. 2.
Figure 6:
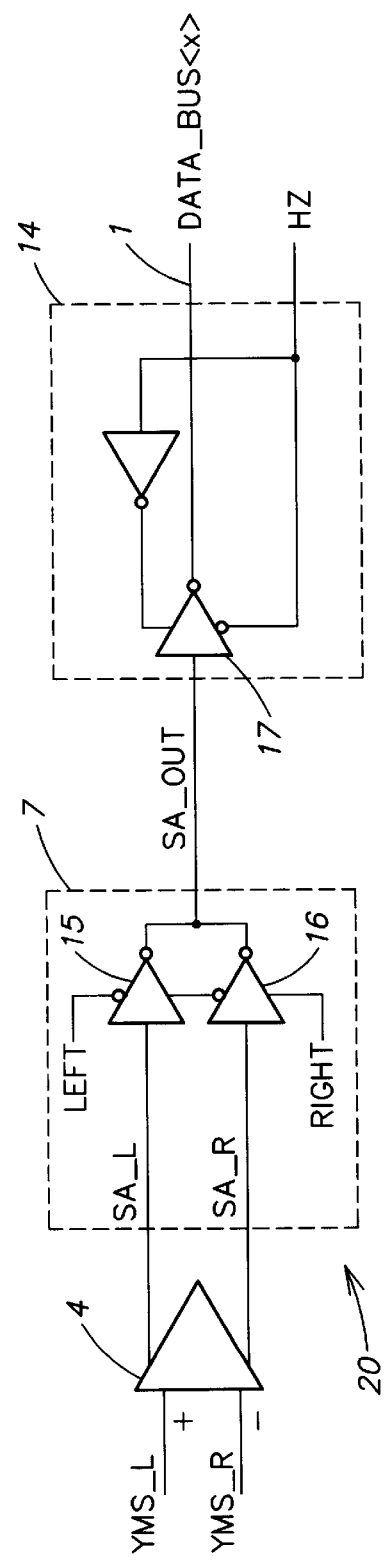
FIG. 6 is a more detailed circuit diagram of the circuit of FIG. 5.

Embodiments of enabling/disabling structures 6 are shown in more detail in FIGS. 5 and 6. Structures 6 comprise enabling/disabling means for the passage of the data of the left half-matrix or of the right half-matrix, designated by the reference numeral 7 in FIGS. 5 and 6, and means 14 for enabling/disabling access of the data of the matrix to the internal bus 1, designated by DATA-BUS in FIGS. 5 and 6. The output of the enabling/disabling structures 6 is sent, by means of line 8, to the internal bus $1_H$ (DATA-BUS).

The programming means $5_R$ and $5_L$ are connected to the internal bus $1_H$ by means of the line 8. This connection on line 8 allows external data to be programmed to the memory. Likewise, the programming means $5_L$ and $5_R$ shown in the right portion of FIG. 2 are connected, by means of a similar line 8, to the internal bus, in this case the bus $1_L$. The programming means $5_L$ and $5_R$ therefore receive in input on line 8 (i.e., the connection to the internal bus), the reference programming voltage VPD-rif, and a programming signal PG-R or PG-L that indicates the half-matrix to be programmed. In the case of the programming means $5_R$, the input programming signal is the signal PG-R for programming the right half-matrix $5_R$; for the programming means $5_L$, the input signal is the signal PG-L. The outputs of the programming means $5_L$ and $5_R$ are sent respectively on the line YMS-L and on the line YMS-R for access to the memory half-matrices.

Switching means 12, driven by a direct memory access signal, respectively DMA-R and DMA-L for direct access to the right and left half-matrix, are adapted to interrupt the connection between the programming means $5_R$ and $5_L$ and the lines YMS-R and YMS-L and to directly connect the left and right memory half-matrices to the internal bus 1 (DATA-BUS) by means of the line 8.

Figure 3:
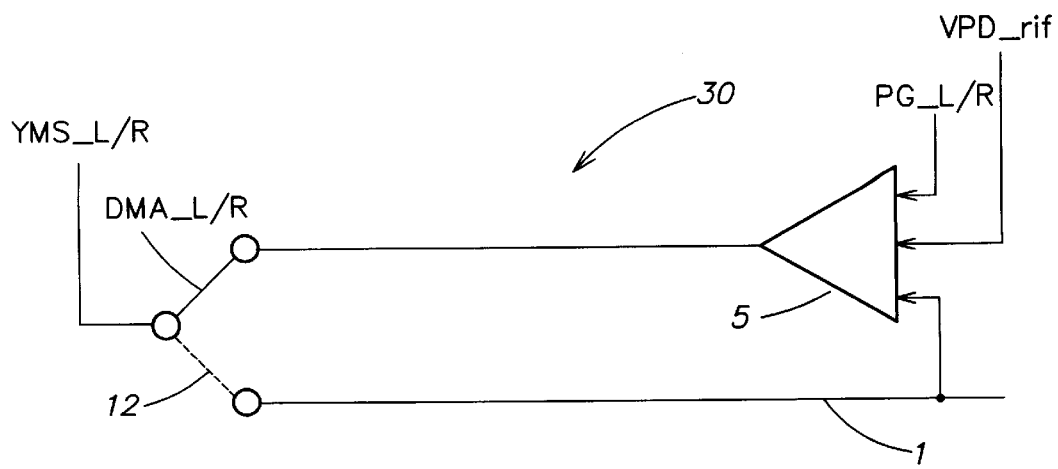
FIG. 3 is a schematic diagram of the circuitry of a portion of the architecture shown in FIG. 2.

FIG. 3 shows the programming unit 30, separated from the architecture according to the invention shown in FIG. 2.

Figure 4:
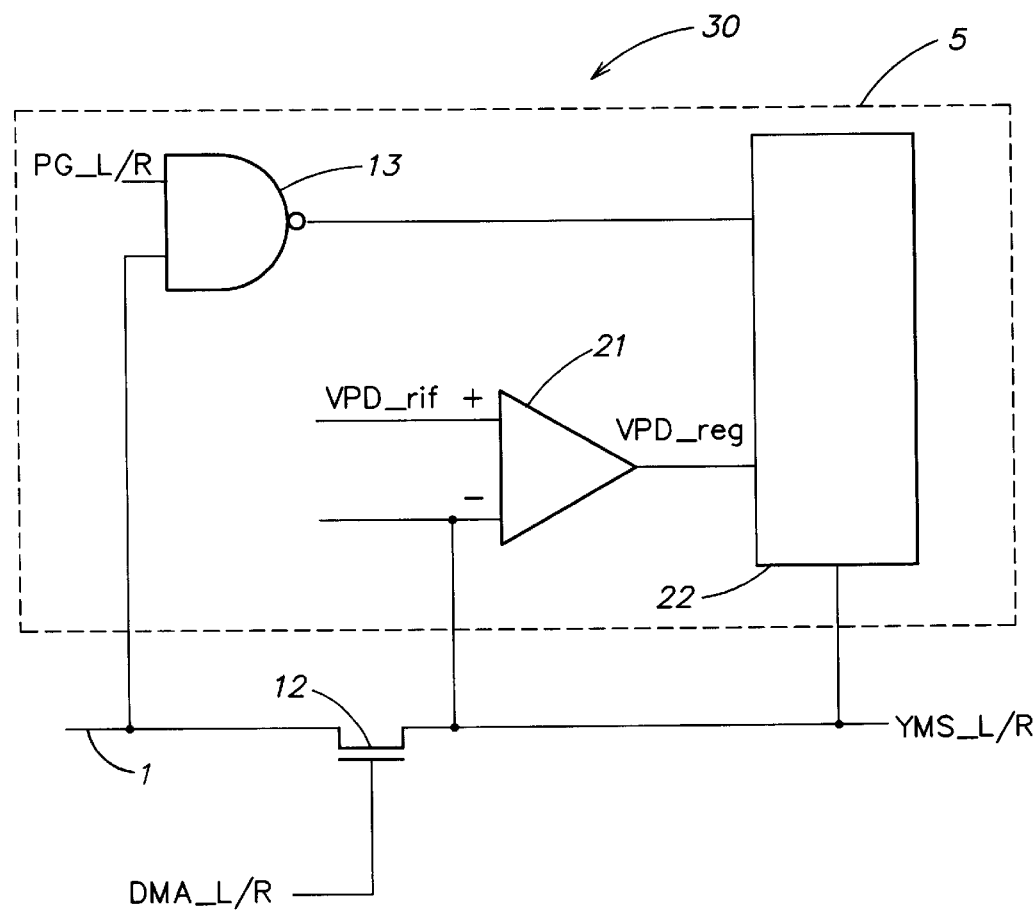
FIG. 4 is a more detailed circuit diagram of the circuitry of FIG. 3.

FIG. 4 is a detailed schematic of the programming unit 30 shown in FIG. 3.

For the sake of generality, the reference numerals are generalized, in these figures and in the ones that follow, by eliminating the suffixes L and H for the high and low internal buses, respectively.

In detail, the programming unit 30, FIG. 4, comprises logic means 13 that receive in input the programming signal PG, the signal L/R that indicates whether the half-matrix to be programmed is the left half-matrix or the right one, and the line that arrives from the internal bus 1 for the flow of external data, by means of the bus, to the memory during programming. The output of the logic means 13 is sent to the programming terminal 22, which is connected to the line YMS-L/R that is adapted to connect the outside world to the left and right memory half-matrices, respectively.

Means 21 for adjusting the programming voltage receive in input the reference programming voltage VPD-rif produced by the voltage dividing means 3 and the programming voltage feedback by the programming terminal 22. Adjustment means 21 are advantageously provided, for example, by a differential amplifier, which receives in input, at its non-inverting terminal, the reference voltage VPD-rif and the output voltage of the programming terminal 22 at its inverting terminal.

Switching means 12, advantageously provided by an N-channel transistor whose gate terminal receives the signal DMA-L/R, allows switching, in the presence of a direct memory access (DMA-L/R) signal, to the direct memory access function, enabling the direct connection between the internal bus 1 and the line YMS-L/R that leads to the memory half-matrices.

FIG. 5 shows the data sensing unit 20, separated from the architecture according to the invention shown in FIG. 2.

FIG. 6 is a detailed schematic of the data sensing unit 20. This figure explicitly shows the means 7 for enabling/disabling the flow of data of the left half-matrix or of the right half-matrix and the means 14 for enabling/disabling the access of said data to the internal bus 1. The enabling/disabling means 7 comprise a first structure and a second structure of the tristate type, designated by the reference numerals 15 and 16 respectively, that receive in input the signals SA-L and LEFT and the signals SA-R and RIGHT, respectively.

The signals LEFT and RIGHT indicate the side of the memory matrix that is affected by the reading operation (the left side or the right side, respectively). The output SA-OUT of the enabling/disabling means 7 passes through the means 14 for enabling/disabling access to the internal bus 1, which are advantageously provided by a tristate structure 17 that receives in input the output signal SA-OUT of the enabling/disabling means 7 and receives, at the gate terminal of its P-type transistor, a signal HZ for enabling/disabling access to the internal bus 1. The gate terminal of the N-type transistor of the tristate structure 14 instead receives in input the inverted signal HZ.

Figure 7:
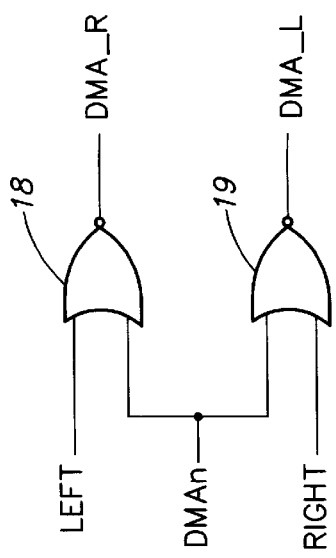
FIG. 7 is a schematic diagram of a circuit for generating signals applied to the circuit of FIG. 6.

FIG. 7 is a view of the circuit for generating the direct memory access signals, respectively for the right half-matrix, DMA-R, and for the left half-matrix, DMA-L. The circuit of FIG. 7 comprises a first NOR gate 18, which receives in input the signal LEFT and an inverted direct memory access signal DMAn, and a second NOR gate 19, which receives in input the signal RIGHT and the signal DMAn. The outputs respectively of the NOR gates 18 and 19 are the signals DMA-R and DMA-L for direct access to the right half-matrix and to the left half-matrix respectively.

With reference to the figures, the operation of the architecture according to the invention is as follows.

The sense amplifier 4 captures the data of the left half-matrix and of the right half-matrix of the memory device. As a consequence of the presence of signals LEFT and RIGHT that are respectively high and low or vice versa, flow of the data from the left half-matrix or from the right half-matrix output from the sense amplifier 4 is enabled by virtue of the action of the enabling/disabling means 7 shown in FIG. 6.

When the data have been enabled for flow out from the sense amplifier 4, they are ready to access the internal bus 1 to be sent to the output terminals (not shown) of the memory device. In this case, the internal bus is used to transfer out the data captured by the reading operation.

This access to the internal bus is controlled by the enabling/disabling means 14 according to the enabling/disabling signal HZ. When the signal HZ is high, the enabling/disabling means are in a high-impedance condition and the data cannot be sent over the internal bus 1.

It should be noted that the redundancy structure also has a configuration that is similar to the diagram of FIG. 2, i.e., a data sensing unit 20 and a duplicated programming unit 30.

The use of a sense amplifier of the reversible symmetrical type balances the reading paths of the memory matrix and mutually matches the propagation times for reading the data on one branch or the other of the sense amplifier.

Regarding the programming step, which is timed by the high signal PG (PG-R and PG-L), each one of the two programming units 30 provided for the left half-matrix and for the right half-matrix is directly connected to the internal bus 1 for the programming of data present on the internal bus 1 in the memory half-matrices. In this case, the internal bus carries external data into the memory.

In the case of parallel programming, the signals for programming the left half-matrix PG-L and for programming the right half-matrix PG-R are both high to enable simultaneous programming, which occurs on both half-matrices. In this manner, column redundancy efficiency is maintained, since it is possible to apply redundancy simultaneously to two defective bit lines in the two memory half-matrices.

In fact, if the bit line that is to be programmed is defective, column redundancy is performed for the defective line and for the corresponding line in the opposite half-plane simultaneously, allowing the redundancy lines provided in replacement of the defective line or lines to be programmed simultaneously. In this manner, the memory device is not rejected if two corresponding bits are simultaneously defective, since the two corresponding bits always belong to the same bit line, which is now split into two half-lines that belong to two opposite half-matrices, the left matrix and the right matrix, can be programmed simultaneously.

It should be noted that the redundancy structure also provides for a configuration that is similar to the diagram of FIG. 2, i.e., a data sensing unit 20 and a duplicated programming unit 30.

The programming unit 30 includes local adjustment means 21 that are adapted to adjust, by feedback, the programming voltage with which the various memory cells of the half-matrices are to be programmed. The reference voltage VPD-rif is sent to adjustment means 21 together with the output voltage of the programming terminal 2 provided for the bit to be programmed. The reference voltage VPD-rif is generated proximate to the programming terminal 2, so that it is free from the voltage drops that are present on the programming line.

The voltage output from the adjustment means 21 and thus fed to the programming terminal 2 is adjusted constantly by utilizing the feedback, in adjustment means 21, of the output voltage of the programming terminal 2. Therefore, the local adjustment means 21 make the programming voltage independent of the voltage drops along the lines, so as to ensure uniform programming of the various memory cells.

Adjustment means 21 allow the programming voltage level carried on the lines YMS-L/R to be independent of the number of cells being programmed, without using particular compensation techniques that are common in other approaches.

Direct memory access from the outside of the memory is controlled by the switching means 12, which are enabled/disabled by the signal DMA-L/R. Direct memory access provides for two dedicated paths 8 that directly connect the internal bus 1 to the left and right memory half-matrix, respectively. Generation of the signals DMA-L/R is controlled by the circuit of FIG. 7, in which the signal DMAn acts as a regulator.

If the direct memory access function is activated (DMAn=0), then if LEFT=1 and RIGHT=0, i.e., if the involved half-matrix is the left one, then DMA-R=0 and DMA-L=1. If LEFT=0 and RIGHT=1, the opposite situation occurs.

In practice, it has been observed that the architecture according to the invention fully achieves the intended aim, since it provides a much faster reading and programming path management than conventional architectures. The possibility of simultaneously programming memory half-matrices that belong to different half-planes considerably speeds up the programming step and, at the same time, avoids the need to reject, during testing, a memory device due to the presence of two defective bits on two different bit lines.

This problem, which is frequent in conventional architecture, was due to the fact that the programming means that program a memory matrix do not apply redundancy to two different lines simultaneously, whereas this is possible with the architecture according to the invention. This is possible because the memory matrix is divided into two half-matrices and the programming means simultaneously program even multiple bits on one half-line of a half-matrix and on the corresponding half-line in the opposite half-matrix. Therefore, it is possible to apply redundancy to both half-lines and to avoid having to reject the memory device during testing or resorting to slower approaches, such as byte propagation.

Programming with a programming voltage that is feedback-adjusted with a constant reference voltage VPD-rif allows all the memory cells to be programmed with a uniform voltage, avoiding the problems of voltage drops along the lines that, in conventional architecture, caused the last cells, in terms of programming time order, to be programmed with voltage values that were distinctly lower than those of the first ones.

Furthermore, the architecture according to the invention ensures alignment of the voltage VPD-reg with the reference voltage VPD-rif, regardless of the number of memory cells being programmed. Locating the voltage dividing means 3 proximate to the programming terminal 2 also makes the reference voltage VPD-rif immune from any voltage drops. The provision of a duplicated programming structure does not increase area consumptions, since the area which is already necessarily provided for the sense amplifiers is used fully for its placement.

Finally, the use of symmetrical and reversible sense amplifiers facilitates balancing of the reading paths of the memory, with the possibility of providing uniform data propagation delays on both sides of the sense amplifiers and uniform data capture. The properties of the architecture according to the invention are also maintained for the redundancy portion of the memory device.

The internal bus 1, which is the only path for data transmission into and out of the memory, provides a minimal and, at the same time, multipurpose transmission structure. In addition to performing the function of sending the data outside the memory for reading and, vice versa, of sending the programming data to the memory, this bidirectional transmission medium also has the function of transmitting additional information regarding the status of the memory, which can be required, for example, during testing.

The architecture thus conceived is capable of numerous modifications and variations, all of which are within the scope of the inventive concept. For example, the splitting of the memory matrix into two half-matrices and the division of said half-matrices into four half-matrix subsections each are merely examples, since it is possible to perform different divisions without abandoning the inventive concept. Furthermore, the enabling/disabling means 14 can also be constituted by two pass transistors, and all the elements disclosed may be replaced with other technically equivalent elements.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. Programming and reading management architecture, particularly for test purposes, for memory devices of the non-volatile type, comprising:

at least two memory half-matrices;

a bidirectional internal bus for the transmission of data to and from the memory half-matrices, said bidirectional internal bus extending between respective half-matrices;

a programming unit for each one of said at least two memory half-matrices; and a data sensing unit;

said programming units being adapted to program said at least two memory half-matrices by transferring programming data from said bidirectional internal bus; and said data sensing unit and said programming units communicating with said bidirectional internal bus to reroute, onto said bus, reading data and programming data of said at least two memory half-matrices.

2. Architecture according to claim 1, wherein said programming units are adapted to program said at least two memory half-matrices in parallel.

3. Architecture according to claim 1, further comprising means for direct access to said at least two half-matrices, said means being enabled by a signal for selecting the half-matrix to be accessed and by a direct access control signal, said direct access means having a duplicated dedicated path for direct access to each one of said at least two memory half-matrices.

4. Architecture according to claim 3, wherein said paths for direct access to said memory half-matrices are enabled and disabled by signals that indicate direct access to one or the other of said memory half-matrices.

5. Architecture according to claim 4, wherein said signals that indicate direct access to one or the other of said memory half-matrices are produced by logic means that receive a signal for selecting one of said memory half-matrices and an inverted direct memory access signal.

6. Architecture according to claim 1, wherein each one of said programming units is driven by a programming control signal and by a signal that indicates which said at least two memory half-matrices is to be programmed.

7. Architecture according to claim 1, wherein each one of said programming units is connected to said internal bus and to one of said memory half-matrices.

8. Architecture according to claim 1, wherein said data sensing unit comprises a sense amplifier, means for enabling and disabling a flow of the data of said at least two half-matrices and means for enabling and disabling access to said internal bus by the data read from said at least two memory half-matrices.

9. Architecture according to claim 8, wherein said means for enabling and disabling the flow of data comprise tristate structures that are driven by signals for selecting said at least two half-matrices to enable and disable the flow of the data related to the selected half-matrix.

10. Architecture according to claim 8, wherein said means for enabling and disabling access of the data of said half-matrices to the internal bus comprise a tristate structure that is driven by a signal for enabling and disabling access to said internal bus.

11. Architecture according to claim 8, wherein said sense amplifier is of a reversible symmetrical type.

12. Architecture according to claim 1, wherein each one of said at least two memory half-matrices is divided into a plurality of half-matrix subsections for the use as hierarchical decoding means.

13. Architecture according to claim 12, wherein each one of said at least two memory half-matrices is divided into four half-matrix subsections.

14. Architecture according to claim 13, wherein each one of said half-matrix subsections comprises a data sensing unit and two programming units.

15. Architecture according to claim 1, further comprising a redundancy line management structure for said at least two memory half-matrices, said structure comprising a data sensing unit and two programming units, said data sensing unit and said programming units being identical to said data sensing unit and said programming units of normal word lines of said memory half-matrices.

16. Architecture according to claim 15, wherein said data sensing unit and said programming units for said redundancy lines communicate with said internal bus to reroute, over said internal bus, redundancy data of said at least two memory half-matrices.

17. Programming and reading management architecture, particularly for test purposes, for memory devices of the non-volatile type, comprising:

at least two memory half-matrices;

a bidirectional internal bus for the transmission of data to and from the memory half-matrices;

a programming unit for each one of said at least two memory half-matrices; and a data sensing unit;

said programming units having programming lines and being adapted to program said at least two memory half-matrices; and said data sensing unit and said programming units communicating with said bidirectional internal bus to reroute, onto said bus, reading data and programming data of said at least two memory half-matrices;

wherein each one of said programming units comprises means for generating a reference programming voltage that is adjusted to make the reference programming voltage independent of voltage drops along programming lines.

18. Architecture according to claim 17, wherein each one of said programming units comprises programming voltage adjustment means that are adapted to locally adjust the reference programming voltage so as to make the reference programming voltage independent of voltage drops along programming lines for programming the memory cells of said at least two memory half-matrices.

19. Architecture according to claim 18, wherein said programming voltage adjustment means receive in input, said reference programming voltage and said programming voltage generated by said programming terminal.

20. Architecture according to claim 17, wherein said reference programming voltage generation means comprise a voltage divider that is arranged proximate to said programming terminal.

21. Programming and reading management architecture, particularly for test purposes, for memory devices of the non-volatile type, comprising:

at least two memory half-matrices;

a bidirectional internal bus for the transmission of data to and from the memory half-matrices;

a programming unit for each one of said at least two memory half-matrices; and a data sensing unit;

said programming units being adapted to program said at least two memory half-matrices; and said data sensing unit and said programming units communicating with said bidirectional internal bus to reroute, onto said bus, reading data and programming data of said at least two memory half-matrices;

wherein said programming units are adapted to program said at least two memory half-matrices in parallel;

wherein said programming units adapted to program said at least two memory half-matrices in parallel are adapted to keep a column redundancy function active, said redundancy being performed simultaneously for both of said at least two memory half-matrices, simultaneously replacing defective lines of said two half-matrices with redundancy lines.

22. A system for reading and programming a non-volatile memory device comprising:

a memory matrix divided into a right half-matrix and a left half-matrix;

an internal bus for the transmission of data to and from said memory matrix;

a number n of data sensing units, each comprising a first input coupled to said left half-matrix and second input coupled to said right half-matrix, for respectively reading data from said left half-matrix and said right-half matrix, and an output coupled to said internal bus; and a number 2n of programming units, having programming lines two of said programming units being associated with each of said data sensing units, wherein a left one of said two programming units is coupled between said left half-matrix and said internal bus and a right one of said two programming units is coupled between said right half-matrix and said internal bus;

wherein said left programming units read data from said internal bus and program said data to said left half-matrix and said right programming units read data from said internal bus and program said data to said right half-matrix;

wherein each one of said programming units comprises means for generating a reference programming voltage that is adjusted to make the reference programming voltage independent of voltage drops along programming lines.

23. The system of claim 22, wherein each data sensing unit comprises:

a sense amplifier having a first input coupled to said left half-matrix and a second input coupled to said right half-matrix, a first output and a second output;

means for enabling and disabling said output of said data sensing unit; and output coupling means for coupling one of said first and second outputs of said sense amplifier to said enabling and disabling means.

24. The system of claim 23, wherein said sense amplifier is of a reversible symmetrical type.

25. The system of claim 22, wherein said programming units are adapted to program said left half-matrix and said right half-matrix in parallel.

26. The system of claim 22, wherein each of said left and right half-matrices is divided into a plurality of half-matrix subsections for use as hierarchical decoding means.

27. The system of claim 26, wherein each of said left and right half-matrices is divided into four half-matrix subsections.

28. The system of claim 27, wherein each of said four half-matrix subsections in each of said half-matrices comprise one data sensing unit and two programming units, one programming unit associated with the left half-matrix and the other programming unit associated with the right half-matrix.

29. A system for reading and programming a non-volatile memory device comprising:

a memory matrix divided into a right half-matrix and a left half-matrix, an internal bus for the transmission of data to and from said memory matrix, a number n of data sensing units, each comprising a first input coupled to said left half-matrix and second input coupled to said right half-matrix, for respectively reading data from said left half-matrix and said right-half matrix, and an output coupled to said internal bus; and a number 2n of programming units, two of said programming units being associated with each of said data sensing units, wherein a left one of said two programming units is coupled between said left half-matrix and said internal bus and a right one of said two programming units is coupled between said right half-matrix and said internal bus, wherein said left programming units read data from said internal bus and program said data to said left half-matrix and said right programming units read data from said internal bus and program said data to said right half-matrix, wherein each data sensing unit comprises, a sense amplifier having a first input coupled to said left half-matrix and a second input coupled to said right half-matrix, a first output and a second output, means for enabling and disabling said output of said data sensing unit; and output coupling means for coupling one of said first and second outputs of said sense amplifier to said enabling and disabling means, wherein each programming unit comprises:

a programming device comprising a first input which receives data from said internal bus, a second input which enables and disables the programming device, a third input for receiving a reference voltage and an output for outputting said data; and direct memory access means for coupling to said memory matrix a direct memory access input from said internal bus.

30. The system of claim 29, wherein said programming device comprises:

a gate which receives said first input and said second input of said programming device and provides an output;

a programming terminal which receives said output and outputs a programming voltage to said memory matrix; and adjustment means for receiving said reference voltage from said third input of said programming device and said programming voltage from said programming terminal and outputting an adjustment voltage to said programming terminal.

31. The system of claim 30, wherein said adjustment means comprises a differential amplifier having an inverting terminal which receives said programming voltage and a non-inverting terminal which receives said reference voltage and an output which outputs said adjustment voltage.

32. The system of claim 29, wherein said direct memory access means comprises a switch which, in response to a direct memory access signal, switches a connection of said programming unit to said memory matrix between said output of said programming device and said direct memory access input.

33. A system, for reading and programming a non-volatile memory device comprising:

a memory matrix divided into a right half-matrix and a left half-matrix, an internal bus for the transmission of data to and from said memory matrix, a number n of data sensing units, each comprising a first input coupled to said left half-matrix and second input coupled to said right half-matrix, for respectively reading data from said left half-matrix and said right-half matrix, and an output coupled to said internal bus; and a number 2n of programming units, two of said programming units being associated with each of said data sensing units, wherein a left one of said two programming units is coupled between said left half-matrix and said internal bus and a right one of said two programming units is coupled between said right half-matrix and said internal bus, wherein said left programming units read data from said internal bus and program said data to said left half-matrix and said right programming units read data from said internal bus and program said data to said right half-matrix, wherein each data sensing unit comprises, a sense amplifier having a first input coupled to said left half-matrix and a second input coupled to said right half-matrix, a first output and a second output, means for enabling and disabling said output of said data sensing unit; and output coupling means for coupling one of said first and second outputs of said sense amplifier to said enabling and disabling means, wherein said output coupling means comprises a first tristate structure coupled to said first output of said sense amplifier and having an output, a second tristate structure coupled to said second output of said sense amplifier and having an output and means for enabling the output of one of said first and second tristate structures while disabling the output of the other of said first and second tristate structures.

34. A system, for reading and programming a non-volatile memory device comprising:

a memory matrix divided into a right half-matrix and a left half-matrix;

an internal bus for the transmission of data to and from said memory matrix;

a number n of data sensing units, each comprising a first input coupled to said left half-matrix and second input coupled to said right half-matrix, for respectively reading data from said left half-matrix and said right-half matrix, and an output coupled to said internal bus; and a number 2n of programming units, two of said programming units being associated with each of said data sensing units, wherein a left one of said two programming units is coupled between said left half-matrix and said internal bus and a right one of said two programming units is coupled between said right half-matrix and said internal bus;

wherein said left programming units read data from said internal bus and program said data to said left half-matrix and said right programming units read data from said internal bus and program said data to said right half-matrix;

wherein said programming units are adapted to maintain column redundancy, said redundancy being performed simultaneously for said left half-matrix and said right half-matrix, thereby simultaneously replacing defective lines of said left and right half-matrices with redundancy lines.

35. An apparatus for programming and reading data to and from a memory device, respectively, the apparatus comprising:

at least two memory sub-matrices;

a bidirectional internal bus for the transmission of data to and from the memory sub-matrices; and means for uniformly programming each of a plurality of memory cells coupled to each of a plurality of programming lines of said memory sub-matrices, wherein said uniform programming means programs said memory cells independent of any voltage drops along said programming lines.

36. The apparatus of claim 35, wherein said uniform programming means comprises a plurality of data sensing units, each coupled between two of said at least two sub-matrices; and a number of programming units, each coupled to a programming line of one of said at least two memory sub-matrices and to one of said plurality of data sensing units.

37. The apparatus of claim 36, wherein each programming unit comprises a programming device including a first input coupled to said internal bus, a second input coupled to receive a reference voltage, a third input coupled to receive a control signal and an output coupled to said one of said at least two memory sub-matrices for outputting a programming voltage.

38. The apparatus of claim 37, wherein each programming device further comprises a gate which receives said first input and said third input, and outputs said programming voltage to a programming terminal connected to said programming line, and an adjustment device which receives said second input and said programming voltage from said programming terminal and outputs an adjusted programming voltage to said programming terminal.

39. The apparatus of claim 38, wherein said gate comprises a NAND gate.

40. The apparatus of claim 38, wherein said adjustment device comprises a differential amplifier having an inverting input coupled to receive said reference voltage from said second input of said programming unit and a non-inverting input coupled to receive said programming voltage from said programming terminal and an output, coupled to transmit said adjusted programming voltage to said programming terminal.

41. The apparatus of claim 40, further comprising direct memory access means for disabling said output of said programming unit and enabling data from said internal bus to provide direct access of data from said internal bus to said programming line, thereby bypassing said programming unit.

* * * * *

UNITED STATES PATENT AND TRADEMARK OFFICE
CERTIFICATE OF CORRECTION

PATENT NO. : 6,148,413
DATED : November 14, 2000
INVENTOR(S) : Luigi Pascucci and Marco Fontana It is certified that error appears in the above-identified patent and that said Letters Patent is hereby corrected as shown below:

On the title page, item [30] should read:

[30]                  Foreign Application Priority Data
    Mar. 29, 1996  (EP)    Europe...................96830161.4

Signed and Sealed this

First Day of May, 2001

Attest:

NICHOLAS P. GODICI

*Attesting Officer*    *Acting Director of the United States Patent and Trademark Office*